United States Patent
Udomoto

(10) Patent No.: US 7,391,268 B2
(45) Date of Patent: Jun. 24, 2008

(54) POWER AMPLIFYING DEVICE COMPRISING A STABILIZING CIRCUIT

(75) Inventor: Junichi Udomoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 70 days.

(21) Appl. No.: 11/447,017

(22) Filed: Jun. 6, 2006

(65) Prior Publication Data

US 2007/0115064 A1    May 24, 2007

(30) Foreign Application Priority Data

Nov. 24, 2005    (JP)    ............... 2005-338509

(51) Int. Cl.
*H03F 3/04*    (2006.01)
(52) U.S. Cl. ................. 330/302; 330/305; 330/306; 333/81 R
(58) Field of Classification Search ........ 330/302, 330/305, 306; 333/81 R
See application file for complete search history.

(56) References Cited

U.S. PATENT DOCUMENTS

| 5,177,452 | A | * | 1/1993 | Honjo ................. 330/277 |
| 5,805,023 | A | * | 9/1998 | Fukuden ............... 330/302 |
| 6,052,029 | A | * | 4/2000 | Uda et al. ............. 330/277 |
| 6,127,894 | A | * | 10/2000 | Alderton .............. 330/286 |
| 6,249,186 | B1 | * | 6/2001 | Ebihara et al. ......... 330/277 |
| 6,339,362 | B1 | * | 1/2002 | Uchida et al. .......... 330/286 |
| 6,462,622 | B1 |   | 10/2002 | Mori et al. |

FOREIGN PATENT DOCUMENTS

JP    2002-353745    12/2002

* cited by examiner

*Primary Examiner*—Patricia Nguyen
(74) *Attorney, Agent, or Firm*—Leydig, Voit & Mayer, Ltd.

(57) ABSTRACT

A power amplifying device includes a stabilizing circuit between an input terminal and an amplifier. The stabilizing circuit has a first line, a second line, and a third line. The first line is connected to the ground. The length of the first line is equal to or longer than three fourths of the wavelength of the operating frequency.

11 Claims, 6 Drawing Sheets

POWER AMPLIFYING DEVICE COMPRISING A STABILIZING CIRCUIT

BACKGROUND OF THE INVENTION

1. Field of the Invention

The present invention relates to power amplifying device, and in particular, to power amplifying device for millimeter and micrometer wave bands.

2. Background Art

In Japanese Unexamined Patent Publication No. 2002-353745, a radio frequency power amplifying device for millimeter and micrometer wave bands is described, which comprises a stabilizing circuit disposed near the transistor in order to allow stable operation.

When the stabilization circuit is disposed in the power amplifying device, there is a possibility not to be able to stabilize enough if the change of the characteristic of the transistor is not considered. That is, to attain satisfactory stabilization, it is necessary to take into consideration the changes of characteristics of the transistor. However, there exists a trade-off relation between the stability and the amplifying capability. Particularly, in the millimeter wave band, if no characteristics margin is given to the transistor, designing the stabilizing circuit so as to secure stability regardless of changes of the characteristics of the transistor is likely to make useless much of its potential as an amplifying device.

SUMMARY OF THE INVENTION

The present invention has been developed to solve the above-described problems, and therefore it is an object of the present invention to provide a power amplifying device capable of exhibiting stable output performance without sacrificing much of its potential as an amplifying device.

The above object is achieved by a power amplifying device comprising an input terminal and an output terminal, an amplifying device disposed between the input terminal and the output terminal, and a stabilizing circuit disposed between the input terminal and the amplifier, wherein the stabilizing circuit comprises the first line which is equal to or longer than three fourths of the wavelength of the operating frequency, and the first line is connected to the ground.

According to the present invention, it is possible to attain a power amplifying device capable of providing stable output performance without sacrificing much of its potential as an amplifying device.

Other features and advantages of the invention will be apparent from the following description taken in connection with the accompanying drawings.

DETAILED DESCRIPTION OF THE PREFERRED EMBODIMENTS

Figure 1:
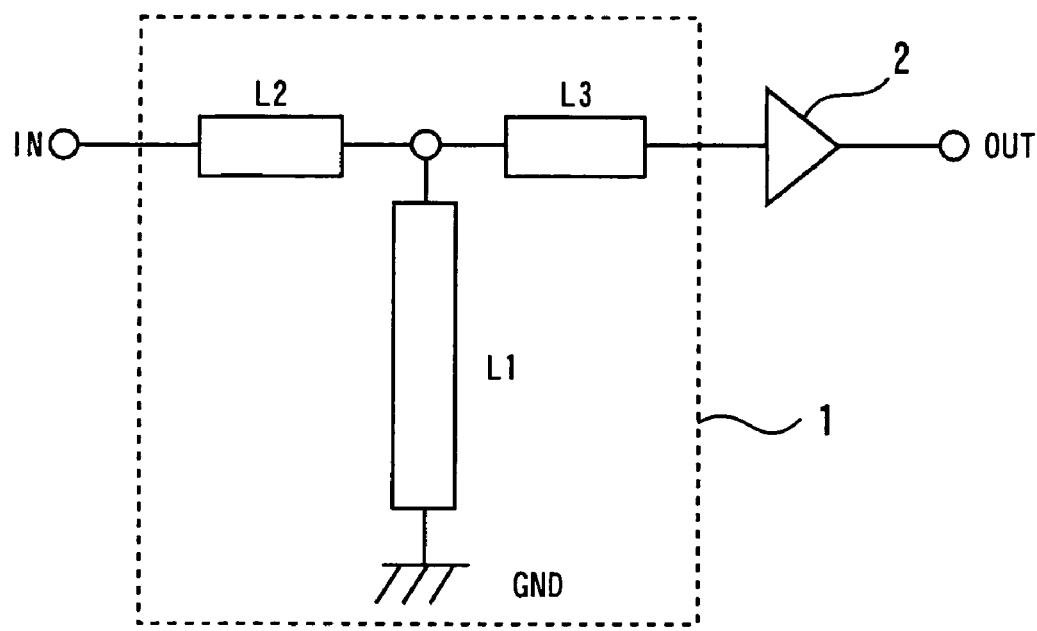
FIGS. 1 and 2 show the circuit configurations of a power amplifying device of the first embodiment.

Embodiments of the present invention will be described below referring to the drawings. In the drawings, the same or equivalent parts will be denoted by the same reference numerals, and the description thereof will be simplified or omitted.

First Embodiment

FIG. 1 shows the circuit configuration of a power amplifying device in accordance with this embodiment of the present invention. An amplifier 2 is disposed between an input terminal (IN) and an output terminal (OUT). Further, a stabilizing circuit 1 is disposed between the input terminal (IN) and the amplifier 2. The stabilizing circuit 1 has lines $L_1$ (the first line), $L_2$ (the second line) and $L_3$ (the third line) whose lengths are $l_1$, $l_2$ and $l_3$, respectively. From the input terminal (IN) to the output terminal (OUT), the lines $L_2$ and $L_3$ are connected in series. The line $L_3$ is connected to the amplifier 2. One end of the line $L_1$ is connected to between the lines $L_2$ and $L_3$. The other end of the line $L_1$ is connected to a ground (GND), that is, earthed. The length $l_1$ of the line $L_1$ is equal to or longer than three fourths of the wavelength $\lambda$ of the operating frequency. The characteristic impedance of each of the lines $L_2$ and $L_3$ is basically made equal to the characteristic impedance (usually 50 ohm) of the system although it may have a different value since these lines are used to adjust characteristics of the amplifier 2.

Figure 2:
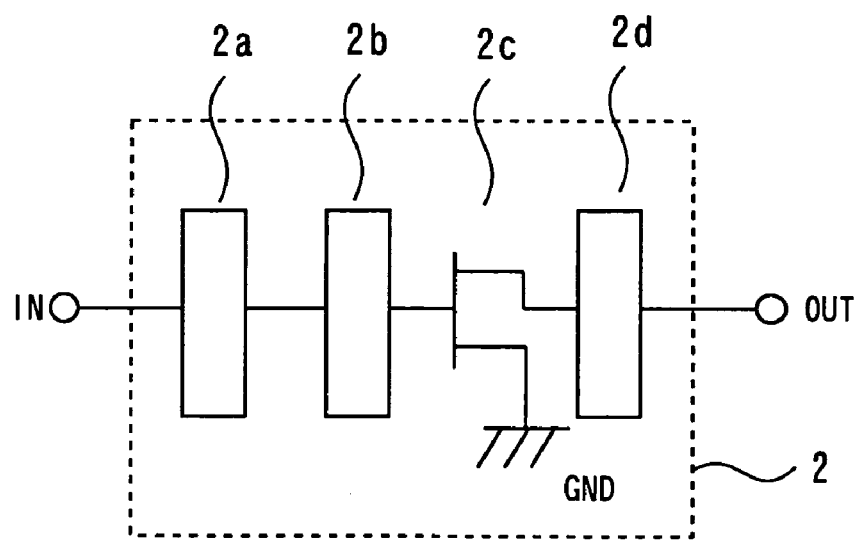

FIG. 2 shows the configuration of the amplifier 2 shown in FIG. 1. (In this figure, the stabilizing circuit 1 of FIG. 1 is omitted.) From an input terminal (IN) to an output terminal (OUT), a matching circuit 2a, a stabilizing circuit 2b, a field effect transistor (hereinafter, denoted as the "FET") 2c and a matching circuit 2d are connected serially.

Figure 3:
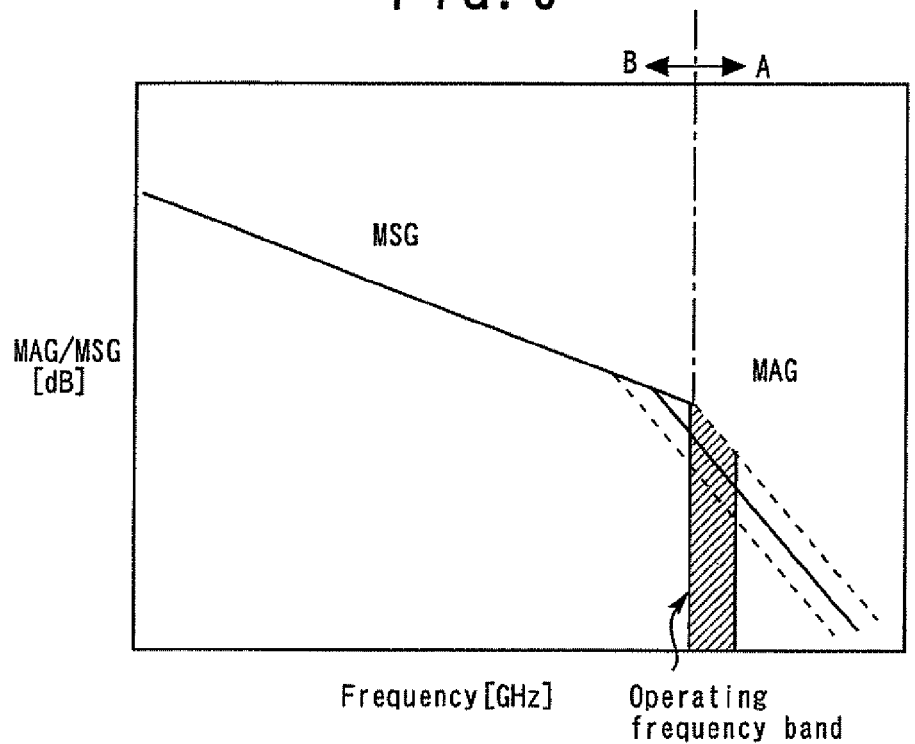
FIG. 3 shows the frequency characteristics of the MAG (Maximum Available Gain) and MSG (Maximum Stable Gain) of the transistor.

FIG. 3 shows the frequency characteristics of the MAG (Maximum Available Gain) and MSG (Maximum Stable Gain) of the transistor. Assume that the amplifier is designed to have its operating frequency band near the boundary between the MAG region (stable region) and MSG region (unstable region) of the transistor. In MGA region A, since the transistor itself is stable, it is not necessary to stabilize the output performance of the amplifier. In MSG region B, however, since the transistor itself is unstable, it is necessary to stabilize the output performance of the amplifier. Therefore, the amplifier must be designed so as to maintain the stability of its output performance even if characteristics of the transistor vary to shift the boundary between MSG region B and MAG region A.

Generally, however, stability of the output performance of an amplifier has a trade-off relation with its amplifying capability. Particularly in the millimeter wave band, if the transistor has no characteristics margin, giving excessive importance to the stability of the output performance is likely to make it impossible to attain sufficient amplifying capability. Reversely, giving priority to the amplifying capability may result in unstable output performance of the amplifier depending on the conditions. Therefore, in the present embodiment, the stabilizing circuit 1 (see FIG. 1) is provided between the input terminal (IN) and output terminal (OUT) of the amplifier 2 while stabilization by the stabilizing circuit 2b near the transistor 2 is minimized.

Figure 4:
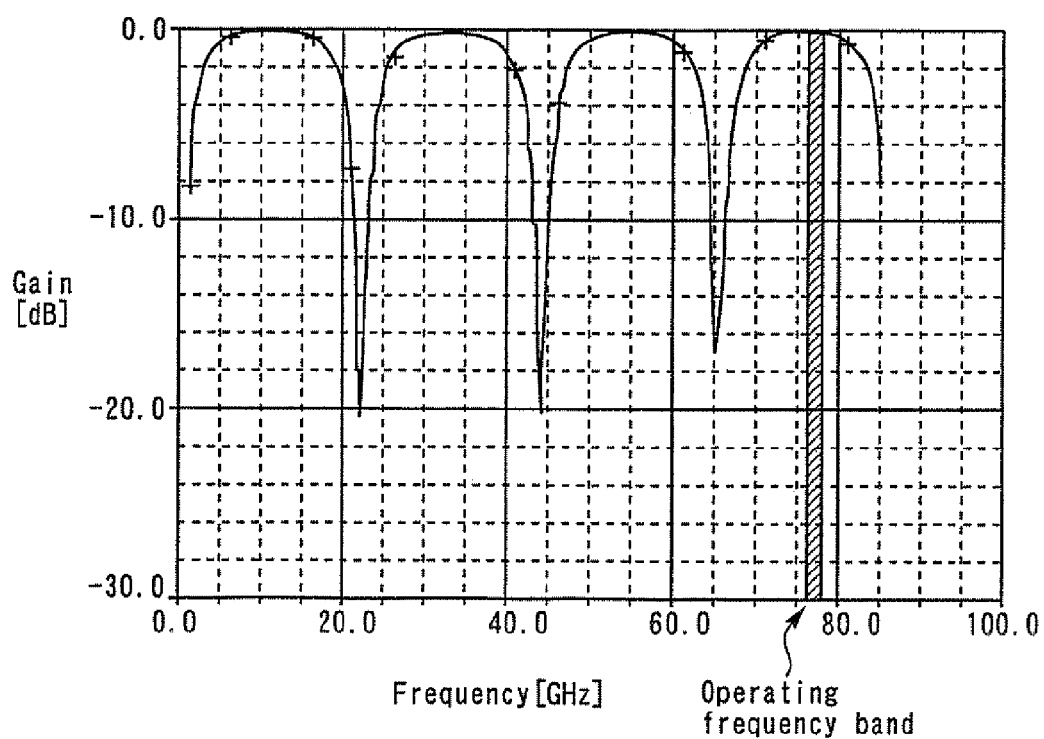
FIG. 4 shows the attenuation characteristic of the stabilizing circuit of the first embodiment.

FIG. 4 shows the attenuation characteristic of the stabilizing circuit 1 itself. The operating frequency of the amplifier is 77 GHz. The length $l_1$ of the line $L_1$ is given by $l_1=(7/4)\cdot\lambda$, wherein λ is the wavelength of the operating frequency. If such a millimeter wave band frequency is used, it is highly probable that an unstable region would be left below and near the operating frequency band. Therefore, $l_1$ must be longer than a half of the wavelength λ. In practical application, it is necessary to set the length equal to or longer than three fourths of the wavelength λ.

As shown in FIG. 4, the stabilizing circuit 1 functions as a periodic bandpass filter exhibiting cutoffs in a DC to low frequency region. It has a cutoff near 22 GHz which is a frequency at which $l_1$ is a half of the wavelength λ. Further, cutoffs appear periodically at multiples of 22 GHz (44 GHz, 66 GHz, 88 GHz, . . . ). There is no attenuation at each middle point (11 GHz, 33 GHz, 55 GHz, 77 GHz, . . . ) between cutoff frequencies.

Accordingly, the stabilizing circuit 1 shows the characteristic of passing around the operating band (76 GHz-77 GHz) without attenuation. That is, the stabilizing circuit 1 does not deteriorate the gain in the operating band. In addition, it has almost no influence on the matching and reflection characteristics in the operating band. It is therefore possible to stabilize the output performance of the amplifier without lowering the amplifying ability around the operating frequency. Note that since this circuit is a passive circuit whose characteristics are substantially determined by the length $l_1$ of $L_1$, manufacturing can be done very steadily once the characteristics are grasped through experimental fabrication.

Figure 5:
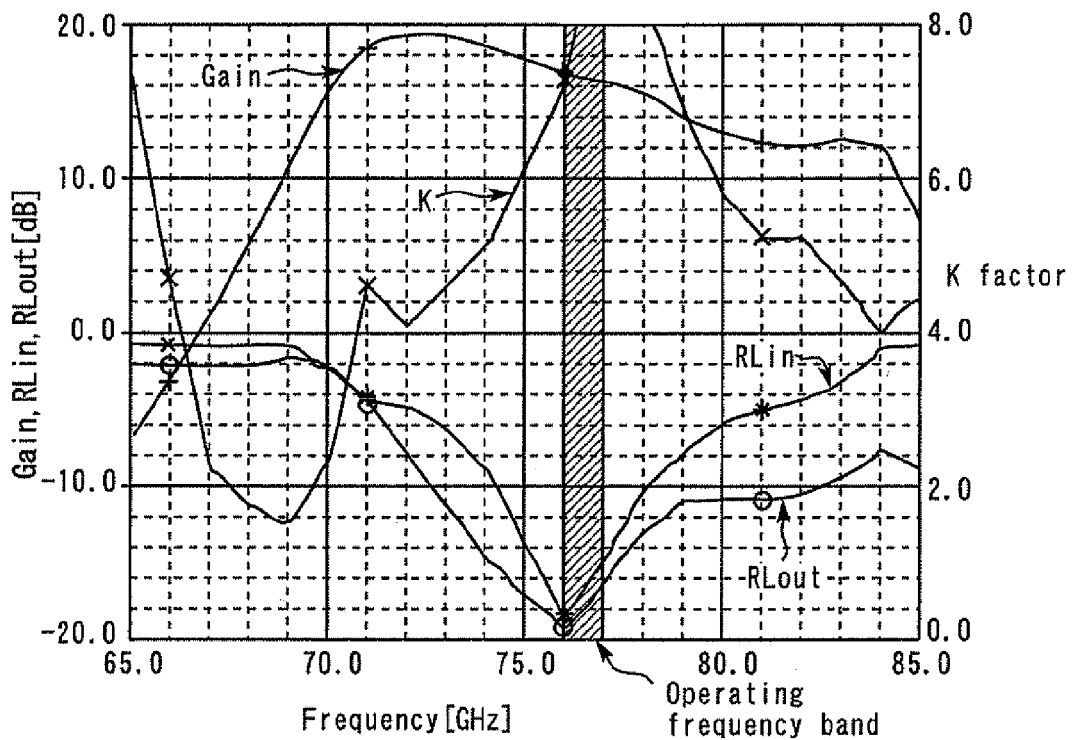
FIG. 5 shows a small signal characteristic of the 77 GHz band amplifying device not provided with the stabilizing circuit.

Then, small signal characteristics of the amplifier not provided with the stabilizing circuit 1 were compared with those of the amplifier provided with the stabilizing circuit 1. FIG. 5 shows small signal characteristics of the 77 GHz band amplifier not provided with the stabilizing circuit 1. Without the stabilizing circuit 1, the K factor falls between 67 and 70 GHz below and near the operating band (77-78 GHz).

Figure 6:
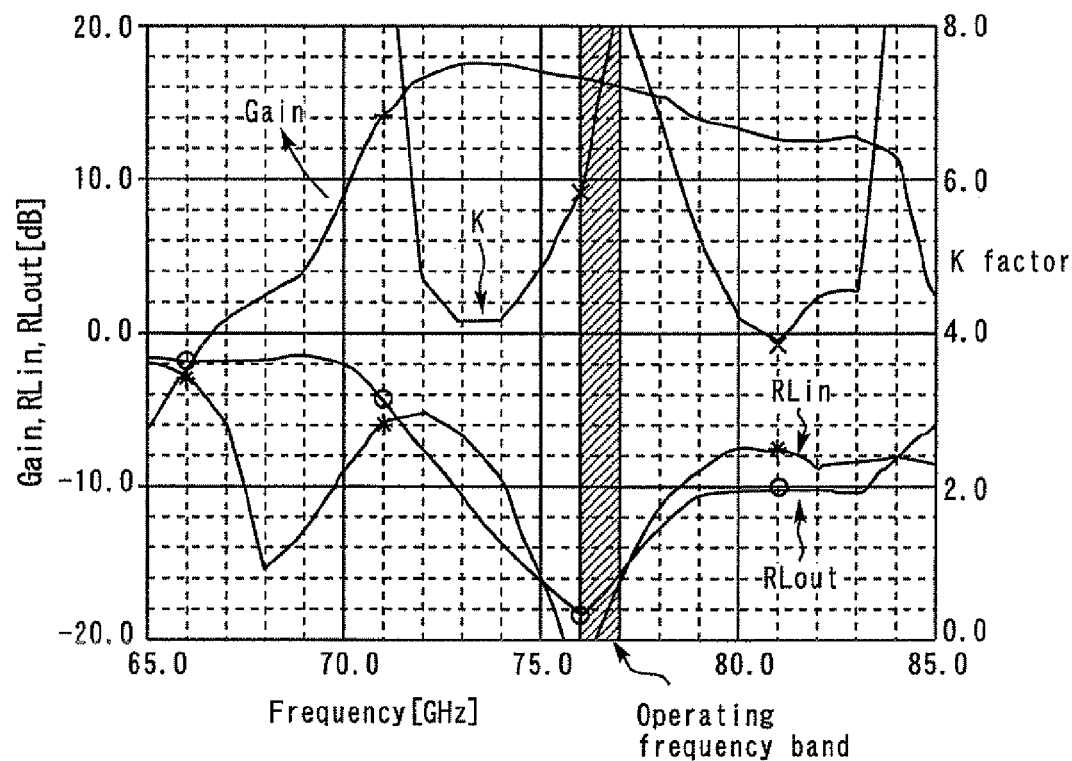
FIG. 6 shows the small signal characteristics of the 77 GHz band amplifying device provided with the stabilizing circuit of the first embodiment.

FIG. 6 shows small signal characteristics of the 77 GHz band amplifier provided with the stabilizing circuit 1. As compared with those (see FIG. 5) of the above one not provided with the stabilizing circuit 1, the fall of the K factor is suppressed in the 65-75 GHz region. As understood from this result, it is possible to stabilize the output performance of the amplifier by adding the stabilizing circuit 1 to improve the K factor below and near the operating band.

Although in the present embodiment, cutoff attenuation around 66 GHz is utilized to stabilize the amplifier at frequencies below and near the operating band, the output performance of the amplifier can be stabilized at around other cutoff frequencies (11 GHz, 33 GHz, 55 GHz and so on), too.

Second Embodiment

Figure 7:
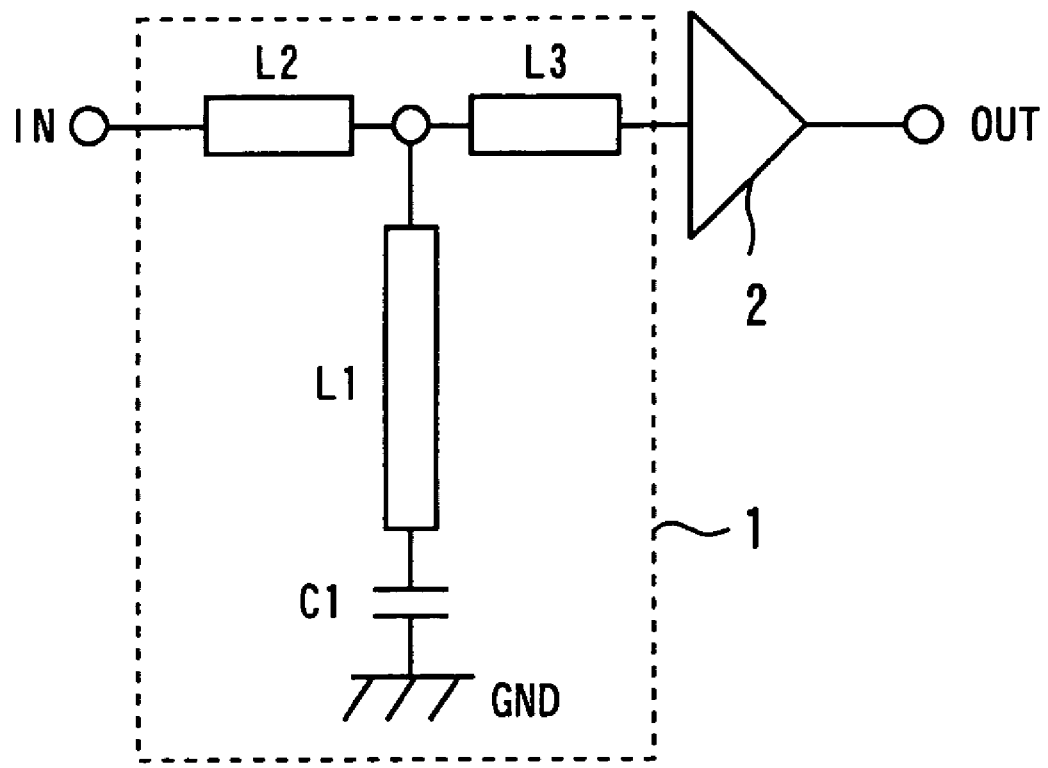
FIG. 7 shows a circuit configuration of a power amplifying device of the second embodiment.
Figure 8:
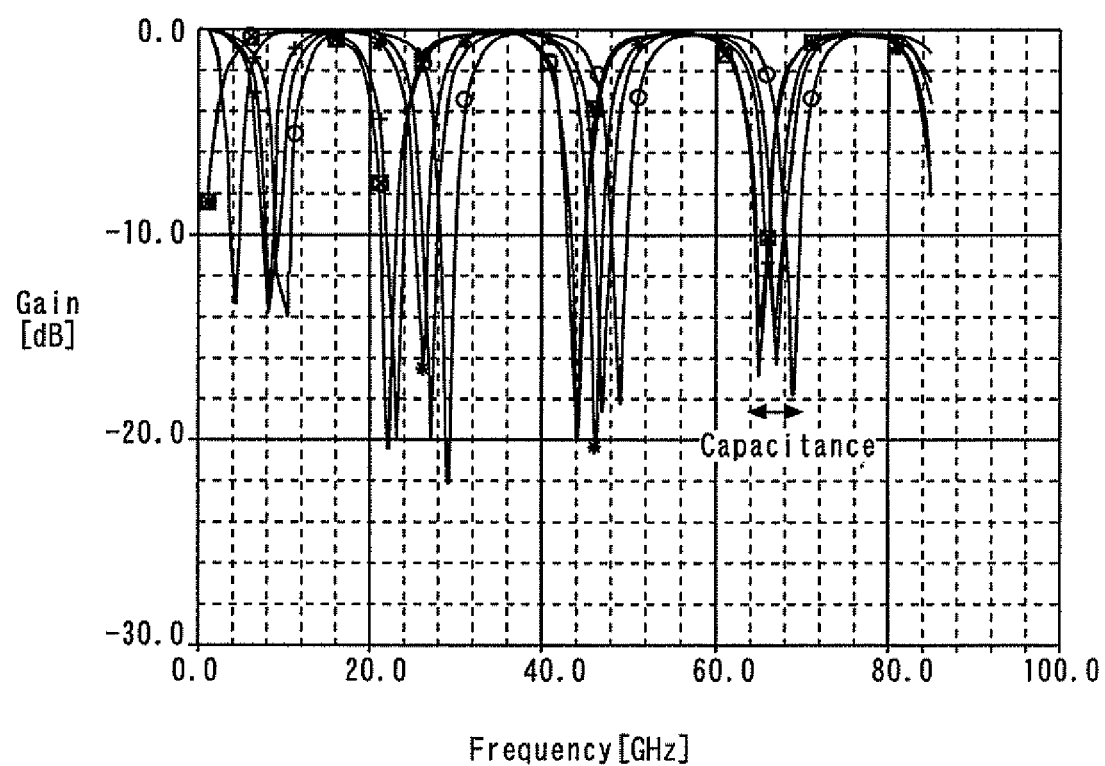
FIG. 8 shows the attenuation characteristic of the stabilizing circuit of the second embodiment.

FIG. 7 shows the circuit configuration of a power amplifying device in accordance with a second embodiment of the present invention. The following description is focused on what is different from the first embodiment. As shown in FIG. 7, a capacitor $C_1$ is provided between the line $L_1$ of the stabilizing circuit 1 and the ground (GND). FIG. 8 shows attenuation characteristics of the stabilizing circuit 1 plotted by shifting the capacitance of the capacitor $C_1$ in a given range.

As shown in FIG. 8, as the capacitance of the capacitor $C_1$ is shifted, the fully passed frequencies and cutoff frequencies shift according to the capacitance. It is therefore possible to stabilize the output performance of the amplifier at desired frequencies by appropriately setting the capacitance of the capacitor $C_1$.

Figure 9:
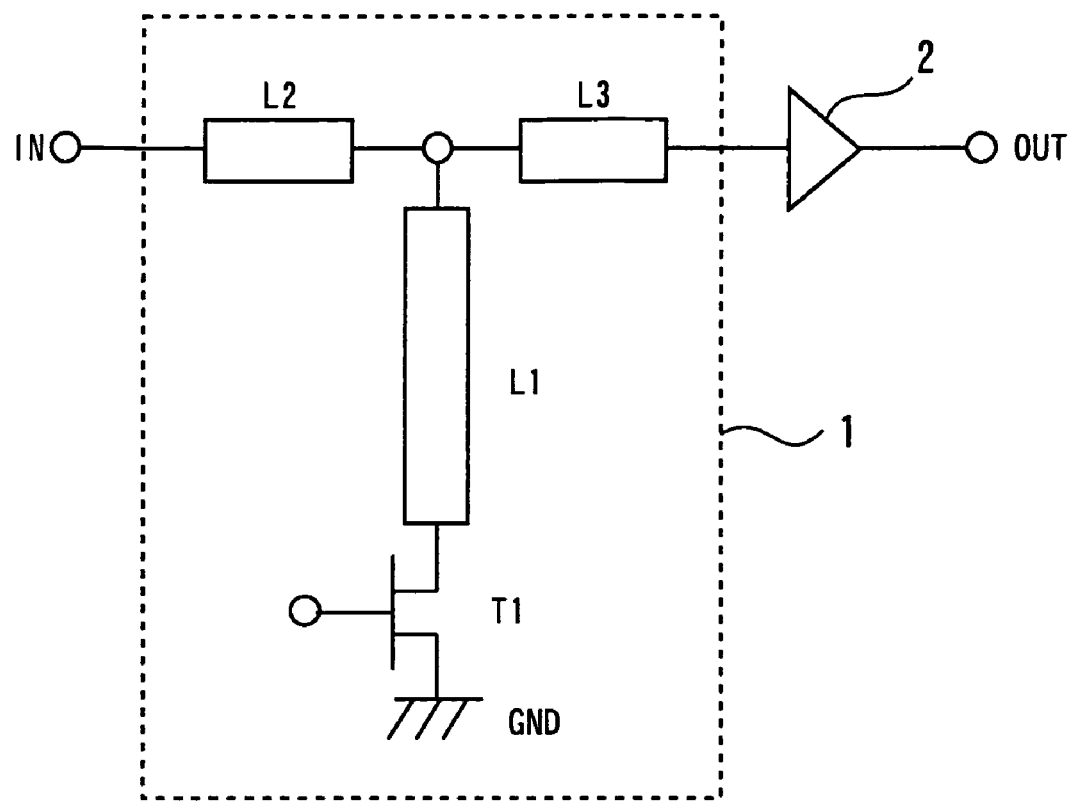
FIG. 9 shows a circuit configuration of a power amplifying device formed by using a FET of the second embodiment.

Shown in FIG. 9 is an example where the above mentioned capacitor $C_1$ is formed by using a FET. The FET ($T_1$) is provided between the line $L_1$ and the ground (GND). The source or drain terminal of $T_1$ is connected to the line $L_1$ and the other terminal is connected to the ground. That is, the off-capacitance between the source and the drain is used as the capacitor $C_1$. Similar to the power amplifying device of FIG. 7, it is therefore possible to stabilize the output performance of the amplifier at desired frequencies by appropriately setting the off-capacitance.

In addition to the effect attained by the first embodiment, the power amplifying device in accordance with the present embodiment can stabilize the output performance of the amplifier at desired frequencies.

Third Embodiment

In the stabilizing circuit 1 of the first embodiment, the length $l_1$ of the line $L_1$ is fixed to a certain length equal to or longer than three fourths of the wavelength of the operating frequency. In the case of the present embodiment, it is possible to choose an appropriate length according to critical frequencies. That is, the length $l_1$ of the line $L_1$ can be changed by selection so as to stabilize the output performance of the amplifier at desired frequencies.

For instance, in the first embodiment, the line $L_1$ has a fixed length longer than at least a half of the wavelength λ of the operating frequency so that cutoff attenuation around 66 GHz is utilized to stabilize the 77-78 GHz band amplifier at frequencies below and near the operating band. In the case of the present embodiment, an appropriate line length can be chosen according to the operating frequency band of the amplifier regardless of the operating frequency band. If an unstable region occurs without the use of the stabilizing circuit 1, it is possible to stabilize the output performance at frequencies in and around the region by selecting a line length appropriate to the unstable region.

In addition to the effect attained by the first embodiment, the power amplifying device in accordance with the present embodiment can stabilize the output performance of the amplifier at desired frequencies.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-338509, filed on Nov. 24, 2005 including specification, claims, drawings and summary, on which the Convention priority of the present application is based, are incorporated herein by reference in its entirety.

The invention claimed is:
1. A power amplifying device comprising:
an input terminal and an output terminal;
an amplifier disposed between the input terminal and the output terminal and amplifying a signal at an operating frequency; and
a stabilizing circuit disposed between the input terminal and the amplifier, wherein
the stabilizing circuit comprises a first line having a length equal to or longer than three fourths of the wavelength of the operating frequency, and
the first line is connected to the ground.

2. The power amplifying device according to claim 1, wherein the stabilizing circuit comprises a second line and a third line connected in series between the input terminal and the amplifier, and a first end of the first line is connected between the second line and the third line, and a second end of the first line is connected to the ground.

3. The power amplifying device according to claim 2, wherein the first line, the second line, and the third line compose a T-shaped circuit.

4. The power amplifying device according to claim 2, wherein the second line and the third line have a predetermined impedance.

5. The power amplifying device according to claim 3, wherein the second line and the third line have a predetermined impedance.

6. The power amplifying device according to claim 1, including a capacitor provided between the first line and the ground.

7. The power amplifying device according to claim 2, including a capacitor provided between the first line and the ground.

8. The power amplifying device according to claim 3, including a capacitor provided between the first line and the ground.

9. The power amplifying device according to claim 4, including a capacitor provided between the first line and the ground.

10. The power amplifying device according to claim 5, including a capacitor provided between the first line and the ground.

11. The power amplifying device according to claim 6, wherein capacitor is provided by a field effect transistor having a source and a drain providing the capacitance.

* * * * *